US 7,916,133 B2

(12) United States Patent
Inokuchi (10) Patent No.: US 7,916,133 B2
(45) Date of Patent: Mar. 29, 2011

(54) BUFFER AMPLIFIER, DRIVER IC AND DISPLAY APPARATUS USING THAT DRIVER IC (75) Inventor: Hiroyuki Inokuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 781 days.

(21) Appl. No.: 11/662,388

(22) PCT Filed: Sep. 6, 2005

(86) PCT No.: PCT/JP2005/016307
§ 371 (c)(1),
(2), (4) Date: Dec. 6, 2007

(87) PCT Pub. No.: WO2006/030666
PCT Pub. Date: Mar. 23, 2006

(65) Prior Publication Data
US 2008/0088616 A1    Apr. 17, 2008

(30) Foreign Application Priority Data
Sep. 13, 2004    (JP) ................... 2004-264852

(51) Int. Cl.
G06F 3/038    (2006.01)
G09G 5/00    (2006.01)
(52) U.S. Cl. .............. 345/212; 345/42; 345/51; 345/52; 345/80; 345/84; 345/204; 330/51; 330/69; 330/253; 330/257; 330/260
(58) Field of Classification Search .............. 345/76–84, 345/87–102, 204, 212
See application file for complete search history.

(56) References Cited

U.S. PATENT DOCUMENTS

| | | | |
|---|---|---|---|
| 6,897,726 B2 * | 5/2005 | Tsuchi | 330/253 |
| 7,142,055 B2 * | 11/2006 | Inokuchi | 330/253 |
| 7,362,169 B2 * | 4/2008 | Liu et al. | 330/51 |
| 2004/0075500 A1 * | 4/2004 | Inokuchi | 330/253 |

FOREIGN PATENT DOCUMENTS

| JP | 2004-032603 | 1/2004 |
|---|---|---|
| JP | 2004-140487 | 5/2004 |

OTHER PUBLICATIONS

English translation of International Search Report for PCT/JP2005/016307, mailed Dec. 20, 2005.

* cited by examiner

Primary Examiner — Bipin Shalwala
Assistant Examiner — Ryan A Lubit
(74) Attorney, Agent, or Firm — Mattingly & Malur, P.C.

(57) ABSTRACT

A buffer circuit is driven with a low voltage and operates at a high speed has first and second comparators constituted by P channel and N channel MOS transistors provided between an input terminal and an output terminal of a buffer amplifier. A predetermined offset voltage is set for the comparing operation, and a switch circuit turns ON/OFF in response to an output signal from the first comparator and the output signal of the second comparator. A leading up of an output voltage from the buffer amplifier is accelerated by the current flowing from a power source line to the output terminal. The buffer circuit also includes an operation restricting circuit for restricting the comparing operation of the second comparator in a range of a dead band of the transistors.

15 Claims, 2 Drawing Sheets

BUFFER AMPLIFIER, DRIVER IC AND DISPLAY APPARATUS USING THAT DRIVER IC

FIELD OF THE INVENTION

The present invention relates to a buffer amplifier, a driver IC and a display device using the driver IC, and more specifically relates to an improvement of a voltage output amplifier used for the display device, which is driven by a low voltage and operates at a high speed.

BACKGROUND ART

An IC driver, namely, a voltage output amplifier such as for a liquid crystal display device and an organic EL display device is required to have a large capacity and to have low power consumption and a high speed output response characteristics. For this reason, the output voltage is required to have a dynamic range from a ground potential to a power source potential.

The present applicant includes a buffer circuit having an output acceleration circuit (an enhancer circuit) in which at an output side of a CMOS buffer amplifier and between the output side and a power source line as well as between the output side and a ground line respective switch circuits are provided and further, two comparators which compare an input voltage and an output voltage of the buffer amplifier are provided (patent document 1). The buffer circuit is for enhancing a through rate of the output voltage signals by feeding from the output acceleration circuit much amount of the output current at the time of the leading up and trailing down of the buffer amplifier.

In the buffer circuit, an offset is provided for the comparison operation of the respective comparators, when the input voltage to the buffer amplifier is in a predetermined range exceeding a predetermined offset voltage with respect to the output voltage, the same is detected by the comparator, when an input signal is led up, the output voltage signal is rapidly led up by turning ON the switch circuit connected to the power source side, when an input signal is trailed down, the output signal is rapidly trailed down by turning ON the switch circuit connected to the ground side, and when the output voltage falls in the range of the offset voltage with respect to the input voltage, only the output of the buffer amplifier is used so that the output voltage corresponding to the input voltage is output from the buffer amplifier.

Further, the offset voltage provided for the comparison operation of the comparators is formed by making use of a threshold value of a pair of MOS transistors, which constitute the comparators.

Patent Document 1: JP 2004-140487 A

The two switch circuits connected respectively to the power source side and the ground side as disclosed in JP 2004-140487 A are ON/OFF controlled by the respective comparators. In this instance, one of the comparators serves as a current switch circuit which corresponds to the leading up side and is constituted by a differential pair of N channel MOS transistors and the other of the comparators serves as another current switch circuit which corresponds to the trailing down side and is constituted by a differential pair of P channel MOS transistors. For this reason, the respective comparators have a dead band (a voltage between source and gate) of about 0.8 V, which is determined by an operational threshold value of the N channel or P channel transistors.

SUMMARY OF THE INVENTION

Tasks to be Solved by the Invention

A MOS transistor usually has a dead band with respect to the input signal below a threshold value in which the transistor is inoperable. Accordingly, a comparator including a differential pair of N channel MOS transistors for leading up signals in a comparing portion starts the operation when input signals exceed the dead band. Further, a comparator of a differential pair of P channel MOS transistors for trailing down signals starts the operation when input signals drops to a voltage below the dead band with reference to the power source voltage, because the dead band exists at the side of the power source voltage.

On one hand, the offset voltage provided for the comparison operation of the comparators is a difference voltage of the input voltage of the buffer amplifier with respect to the output voltage. Therefore, since as the difference voltage, a voltage more than the operational threshold value of the differential pair transistors in the comparators is provided, the dead band at the time of operation start of the differential pair transistors still remains during the comparison operation.

Although a buffer amplifier, in particular, a buffer amplifier driven by a low voltage is required to be operable in the rail-to-rail from the ground potential to the power source potential, for the dead band of about 0.8 V of the output acceleration circuit (the comparator thereof) in this instance, the operation is determined only by the buffer amplifier, there arises a drawback to drop the through rate. When this sort of buffer amplifier is used as an IC driver such as for a liquid crystal display device and an organic EL display device, the through rate thereof drops down which affects drive frequencies in horizontal direction and obstacles the resolution increase.

In particular, a driver for generating a drive voltage (a writing voltage) for a capacitor in a pixel circuit for an active matrix type organic EL display device is required to set the drive voltage of about 4.0 V in an operating speed of below 10 , sec until leading up of an output signal, which causes a problem.

An object of the present invention is to resolve these conventional problems and to provide a buffer circuit, which is driven by a low voltage and operates in a high speed.

Another object of the present invention is to provide a driver IC including a buffer circuit, which is driven by a low voltage and is permitted to generate an output voltage having a large dynamic range from a reference potential line (for example, the ground) near to a power source potential.

Still another object of the present invention is to provide a display device, which is permitted to display at a high speed with a low power consumption.

Measure for Resolving the Tasks

A buffer amplifier, a driver IC or a display device using the driver IC according to a first aspect of the present invention which achieves these objects is characterized in that a buffer circuit therefor comprises a first comparator in which a comparing portion is constituted by one of P channel and N channel MOS transistors provided between an input terminal and an output terminal of a buffer amplifier for comparing an input voltage and an output voltage of the buffer amplifier and a predetermined offset voltage is set for the comparing operation in the comparing portion, and which generates an output signal when the offset voltage is exceeded and a switch circuit which turns ON/OFF in response to the output signal from the first comparator, wherein a leading up of an output voltage or a trailing down of an output voltage from the buffer amplifier is accelerated by flowing current from a power source line to the output terminal or from the output terminal to a reference potential line in response to ON or OFF of the switch circuit, the buffer circuit further comprises a second comparator of which comparing portion is constituted by the other of P channel and N channel MOS transistors for comparing between the input voltage and the output voltage and an operation restricting circuit for restricting the comparing operation of the second comparator in a range of a dead band of the one of P channel and N channel MOS transistors constituting the comparing portion for the first comparator, wherein the switch circuit is turned ON or OFF in response to the output signal of the first comparator and the output signal of the second comparator.

Further, in a second aspect of the present invention, a buffer circuit therefor comprises a first comparator in which a comparing portion is constituted by one of P channel and N channel MOS transistors provided between an input terminal and an output terminal of a buffer amplifier for comparing an input voltage and an output voltage of the buffer amplifier and a first offset voltage is set for the comparing operation in the comparing portion, and which performs the comparing operation when the first offset voltage is exceeded, a second comparator in which a comparing portion is constituted by the other of P channel and N channel MOS transistors for comparing the input voltage and the output voltage and a second offset voltage is set for the comparing operation in the comparing portion, and which performs the comparing operation when the second offset voltage is exceeded, a first switch circuit which turns ON/OFF in response to an output signal from the first comparator, a second switch circuit which turns ON/OFF in response to an output signal from the second comparator, wherein a leading up of an output voltage from the buffer amplifier is accelerated by flowing current from a power source line to the output terminal in response to ON or OFF of the first switch circuit and a trailing down of an output voltage from the buffer amplifier is accelerated by sinking current from the output terminal to a reference potential line in response to ON or OFF of the second switch circuit, the buffer circuit further comprises a third comparator of which comparing portion is constituted by the other of P channel and N channel MOS transistors for comparing between the input voltage and the output voltage of the buffer amplifier, a fourth comparator of which comparing portion is constituted by the one of P channel and N channel MOS transistors for comparing between the input voltage and the output voltage of the buffer amplifier, a first operation restricting circuit which restricts the comparing operation of the third comparator in a range of a dead band of the transistors constituting the comparing portion for the first comparator, a second operation restricting circuit which restricts the comparing operation of the fourth comparator in a range of a dead band of the transistors constituting the comparing portion for the second comparator, wherein the first switch circuit is turned ON or OFF in response to the output signal of the first comparator and the output signal of the third comparator and the second switch circuit is turned ON or OFF in response to the output signal of the second comparator and the output signal of the fourth comparator.

ADVANTAGES OF THE INVENTION

In order to enhance the through rate, it is preferable that the predetermined offset voltage for the comparator in the output acceleration circuit is set at a low voltage value as much as possible. Although the predetermined offset voltage also depends on the output current value of the buffer amplifier, in a buffer circuit used for a driver circuit such as for an organic EL display device, the offset voltage assumes a voltage value at least less than the dead band of the transistors constituting the comparing portion with regard to an output current in , A order of the buffer amplifier, and is needed to be set at 0.1 V or less. Moreover, the comparing operation starts above from the dead band.

On one hand, in the output acceleration circuit, which supplies current from the power source line by turning ON the switch circuit, an overshooting is likely caused, because the current is rapidly supplied to the output terminal. For this reason, there exists a limitation for lowering the predetermined offset voltage, which determines starting the comparison between the input voltage and the output voltage of the buffer amplifier. Thus, an enhancement of the through rate is difficult.

Accordingly, in the present invention, the first comparator is designed to be operable above the dead band region by suppressing the offset voltage near the limit, for example, to about 0.1 V for preventing the overshooting. Further, the second comparator including P channel or N channel MOS transistors different from those MOS transistors constituting the comparing portion of the first comparator is provided and the comparing operation of the second comparator is restricted so as to operate in the dead band region of the first comparator. By restricting the operation region of the second comparator in the dead band region, the second comparator, of which offset voltage is not substantially set, does not affect the first comparator, which performs the comparing operation at the predetermined offset voltage. Thereby, the predetermined offset voltage of the first comparator can be lowered near to the limit of preventing the overshooting, and since in the dead band of the first comparator the second comparator operates without affecting the operation of the first comparator, the through rate can be enhanced.

Now, when the output acceleration circuit is operated respectively in response to a leading up signal and a trailing down signal, respective corresponding comparators are needed. In this instance, it is conceived that if a comparator with a comparing portion of a P channel MOS transistor and an N channel MOS transistor is provided in parallel with another comparator (at the side of the output acceleration circuit) with a comparing portion of an N channel MOS transistor and a P channel MOS transistor, and if in a dead band region of one transistor the other transistor is operated, the dead bands can be eliminated for the respective comparing operations.

However, if constituted in such a manner, the other comparator, which is provided in parallel with the comparator (at the side of the output acceleration circuit) including an N channel MOS transistor and a P channel MOS transistor and is operated in the dead band, has to be constituted by transistors of a same type as those for a comparator with an offset voltage. Therefore, transistors of a same type are respectively driven in parallel in substantial period from the leading up to the trailing down of an output voltage signal. Even if the comparator is provided with a predetermined offset voltage, when the load current increases, an overshooting of a leading up signal and a trailing down signal can not be prevented which leads to ringing. Accordingly, it has been found that such a conceptual circuit cannot be used in practice.

However, when the above operation restricting circuit is provided, an operation range of a comparator, which operates in the dead band in both at the leading up side and at the trailing down side and of which offset voltage is not substantially set, is restricted near the dead band region, thereby, the parallel drive of the comparators constituted by same type transistors is eliminated at the later part of a leading up signal or the later part of a trailing down signal and the ringing is prevented even if the comparing and detecting operation varies.

As a result, according to the present invention, for example, even when a buffer amplifier is one that is required to operate rail-to-rail from the ground potential to the power source potential, the buffer amplifier can be operated at a high through rate, thus, a buffer circuit which is driven in a low voltage and operated in a high speed can be easily realized. Further, by making use of this buffer circuit, an IC driver, which generates an output voltage having a large dynamic range from a reference line (ground) near to the power source potential and a display device, which permits a high speed display with a low power consumption, can be easily realized.

BEST MODES FOR CARRYING OUT THE INVENTION

Figure 1:
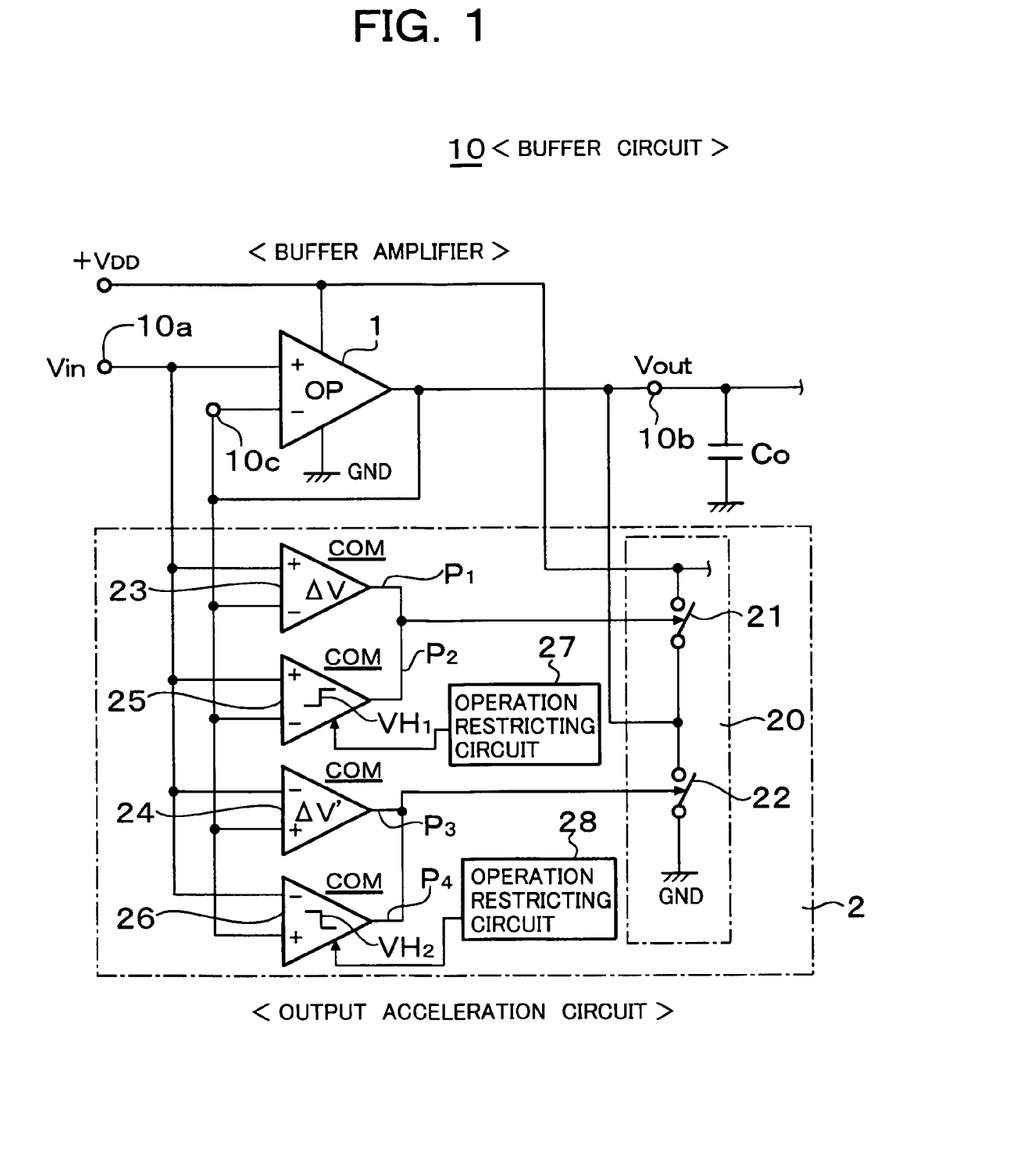
FIG. 1 is a block diagram of an embodiment of a buffer circuit to which the present invention is applied.

In FIG. 1, reference numeral 10 designates a buffer circuit and is constituted by a buffer amplifier 1 and an output acceleration circuit 2. The output acceleration circuit is constituted by a switch circuit 20, comparators (COM) 23-26 and operation restricting circuits 27 and 28, and the switch circuit 20 is constituted by a switch circuit 21 and a switch circuit 22.

The buffer amplifier 1 is constituted by such as operational amplifier (OP) and a differential amplifier circuit, and the output side thereof is fully fed back to (−) input terminal (an inverted input terminal) 10c and forms a voltage follower. The buffer amplifier 1 operates at a potential between a power source voltage +VDD and the ground line GND (reference potential line), namely in the rail-to-rail. The voltage of the power source voltage line +VDD is 5.0 V in the present embodiment.

Between (+) input terminal (non-inverted input terminal) 10a and an output terminal 10b of the buffer amplifier 1 a leading up side comparator (COM) 23 and a trailing down side comparator (COM) 24 are provided. These comparators 23 and 24 receive the input voltage and the output voltage of the buffer amplifier 1 at the input sides thereof and compare these voltages, and the comparator 23 detects a voltage difference more than $\Delta V$ between these voltages and the comparator 24 detects a voltage difference more than $\Delta V'$ between these voltages. The comparators 23 and 24 respectively turn ON/OFF the switch circuits 21 and 22 in response to respective comparison results.

Namely, the comparator 23 constitutes an input stage circuit at the leading up side of the acceleration circuit, and of which (+) input terminal is connected to the (+) input terminal 10a of the buffer amplifier 1 and of which (−) input terminal is connected to (−) input terminal 10c of the buffer amplifier 1 respectively. The comparator 24 constitutes an input stage circuit at the trailing down side of the acceleration circuit, and of which (−) input terminal is connected to the (+) input terminal 10a and of which (+) input terminal is connected to the (−) input terminal 10c respectively.

When a difference of the input voltage Vin of the buffer amplifier 1 with respect to the output voltage Vout is more than $\Delta V$, the comparator 23 turns ON the switch circuit 21 and when a difference of the input voltage Vin of the buffer amplifier 1 with respect to the output voltage Vout is more than $\Delta V'$, the comparator 24 turns ON the switch circuit 22.

The switch circuit 21 is provided between the power source voltage line +VDD and the output terminal 10b and the switch circuit 22 is provided between the output terminal 10b and the ground line GRN.

The potential difference $\Delta V$ is an offset voltage with respect to a comparing operation start voltage set at the comparator 23 and the potential difference $\Delta V'$ is an offset voltage with respect to a comparing operation start voltage set at the comparator 24. In the present embodiment, these potential differences are set at about 0.1 V that is near to a limit suppressing an overshooting. Further, whether $\Delta V=\Delta V'$ or not is not limited.

Co connected to the output terminal 10b is a capacitor serving as a load. The input voltage signal Vin is applied to the (+) input terminal 10a and is usually a pulse signal having steep leading up and trailing down edges. The output voltage signal Vout is a voltage signal generated at the output terminal 10b.

Since a comparing portion in the comparators 23 and 24 is usually constituted by a pair of MOS transistors in differential operation of one of P channel and N channel, the comparators 23 and 24 have respectively a dead band of about 0.8 V caused by an operation threshold value which is determined by their gate threshold value VTH.

Therefore, between the (+) input terminal 10a and the output terminal 10b a dead band operative comparator 25 is provided which operates in the dead band region of the leading up side comparator 23, and an operation restricting circuit 27 for restricting the operation of the comparator 25 in a range of dead band VTH1 is further provided. Further, between the (+) input terminal 10a and the output terminal 10b a dead band operative comparator 26 is provided which operates in the dead band region of the trailing down side comparator 24, and an operation restricting circuit 28 for restricting the operation of the comparator 26 in a range of dead band VTH2 is further provided.

(+) input terminal of the comparator 25 is connected to the (+) input terminal 10a and (−) input terminal thereof is connected to the (−) input terminal 10c respectively. (−) input terminal of the comparator 26 is connected to the (+) input terminal 10a and (+) input terminal thereof is connected to the (−) input terminal 10c respectively. These comparators 25 and 26 are respectively constituted by differential pair of MOS transistors having a high pair forming property and the comparing portions in these comparators have no substantial offset voltage with respect to the comparing operation.

Figure 2:
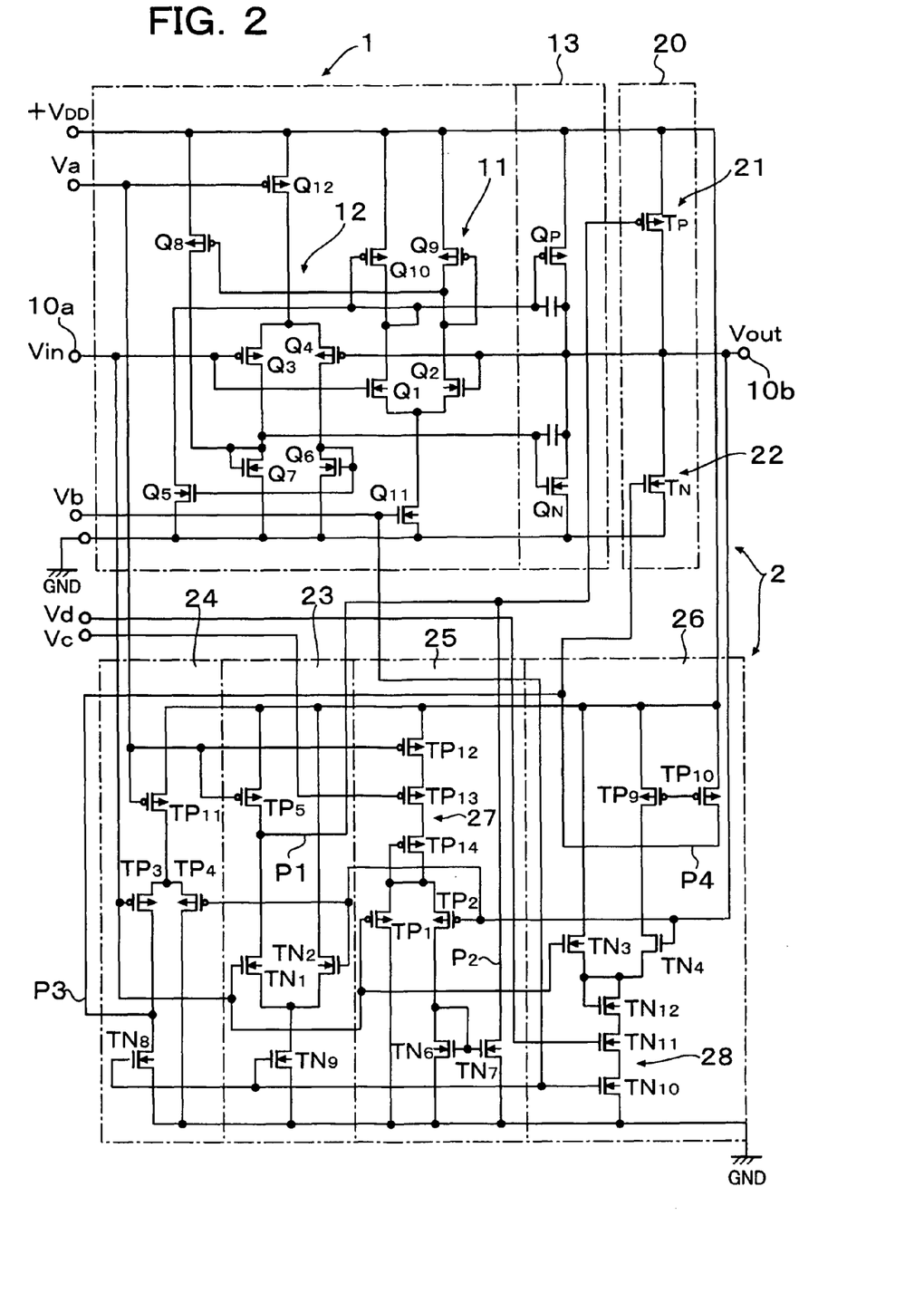
FIG. 2 is a concrete circuit diagram of the buffer circuit shown in FIG. 1.

Since the buffer amplifier 1 is constituted as a circuit including therein a constant current source and an amplifier circuit such as a differential amplifier circuit, correspondingly, the operation speed thereof is low in comparison with a circuit for switch operation. On one hand, since the comparators 23, 24, 25 and 26 are constituted by current switch circuits for switch operation as shown in FIG. 2, the operation speed thereof is higher than that of the buffer amplifier 1.

Further, since the buffer amplifier 1 is one that receives the input voltage signal Vin and generates the output voltage signal Vout depending on the received voltage, and the timing of leading up and trailing down of the output voltage signal Vout with respect to the input voltage signal Vin delays, when a pulse shaped input voltage signal Vin is applied, a potential difference between the input voltage signal Vin and the output voltage signal Vout is generated. The comparators 23 and 24 compare and detect this potential difference.

Now, an operation of the comparator 23 will be explained. When the input voltage signal Vin leads up and the potential difference between the input voltage signal Vin and the output voltage signal Vout exceeds the dead band (=0.8 V), the comparator 23 starts the operation, and when the difference $\Delta V$ (=Vin—Vout) is equal to or more than 0.1 V under a condition of Vin>Vout, the switch circuit 21 is turned ON by a detection signal P1 of the comparator 23. At this moment, for the output current of slow leading up of the buffer amplifier 1, a current is supplied in high speed from the power source voltage line +VDD to the output terminal 10a via the turned ON switch circuit 21 to thereby lead up the output voltage signal Vout in high speed.

The amount of current supplied from the switch circuit 21 at this moment is larger than the output current value of the buffer amplifier 1. Since the load Co is connected to the output terminal 10b, even when the switch circuit 21 is in ON state, the relationship that $\Delta V$ (=Vin−Vout) is more then 0.1 V is usually kept under a leading up state, and the load Co is charged by the sum of the output current value of the buffer amplifier 1 and the current value supplied from the switch circuit 21. Further, at this moment, since no output signal is generated at the trailing down side comparator 24, the switch circuit 22 is in OFF state.

When the input voltage Vin approaches "H" (HIGH level), the output voltage signal Vout follows the leading up of the input voltage signal Vin and finally the potential difference between the input voltage signal Vin and the output voltage signal Vout drops below $\Delta V$ (=0.1 V), and the detection signal P1 of the comparator 23 ceases and the switch circuit 21 is turned OFF and the output voltage signal Vout reaches to the voltage value for "H" with the output current from the buffer amplifier 1 of slow leading up.

In this instance, when the comparing portion in the comparator 23 is constituted by MOS transistors, because of the existence of the dead band determined by the gate threshold value VTH1, although when the input voltage signal Vin is less than 0.8 V, the comparator 23 is inoperative, however, the comparator 25 is operative. Accordingly, although the detection signal P1 which turns ON the switch circuit 21 is not generated from the comparator 23, if at this moment, the comparator 25, which operates in the dead band region VTH1 (0V~0.8V, wherein in a region of Vin>Vout) of the comparator 23, is in a state of Vin>Vout, the comparator 25 generates a detection signal P2 and turns ON the switch circuit 21. Thereby, the output voltage signal Vout also enables to lead up in high speed at the initial leading up stage of the input voltage signal Vin.

Since the operation of the comparator 25 is restricted in a range of the dead band region VTH1 (0V~0.8V) of the comparator 23 by the operation restricting circuit 27, when the dead band region is exceeded, the detection signal P2 which turns ON the switch circuit 21 ceases, however, at this moment since the comparator 23 has already started the operation, the detection signal P1 is generated and the ON state of the switch circuit 21 is maintained as it is. In this manner, the operation restricting circuit 27 restricts the operation of the comparator 25. Accordingly, at the time of change over between the comparator 25 and the comparator 23, the switch circuit 21 receives the detection signals P1 and P2 from both and is rendered in ON state. When the input voltage signal Vin approaches "H" and the potential difference between the input voltage signal Vin and the output voltage signal Vout drops below $\Delta V$ (=0.1 V), the switch circuit 21 turns OFF. At this moment, the comparator 25 is not operated. Moreover, because of a leading up period, the comparator 26 is also not operated.

As a result, since the switch circuit 21 is not affected by the dead band of the comparator 23, the switch circuit 21 is turned ON.

Further, since the output signal of the comparator 23 is generated at a voltage of the dead band+the potential difference $\Delta V$, in considering this point, in a region where the input voltage signal Vin shifts from the dead band region to the normal operation region, namely, in a voltage region moving in the dead band of the MOS transistors constituting the comparing portion of the comparator or in a voltage region moving out of the dead band, the switch circuit 21 is designed to turn ON by receiving both output signals from the comparator 23 and the comparator 25. When the dead band voltage of the input voltage signal Vin, namely, the between source-gate voltage is given as 0.8 V, it is appropriate to cease the output signal of the comparator 25 in a range of about +0.2 V, which is larger than the potential difference $\Delta V$=0.1+0.8 V, with respect to the given voltage, and a higher voltage of about 1.0 V than the potential of the ground GND is set as the operation stop voltage of the comparator 25 by the operation restricting circuit 27, which will be explained later. Further, the voltage for stopping the output signal of the comparator 25 is enough if it falls in a range smaller than the half voltage after the input voltage signal having led up.

Likely, when the input voltage signal Vin trails down, only the comparators 23 and 25 are changed over to the comparators 24 and 26 and the switch circuit 21 is changed over to the switch circuit 22, and the ON/OFF switching operation of the switch circuit 22 is performed likely in response to the trailing down of the input voltage signal Vin. Namely, when the input voltage signal Vin trails down and the potential difference between the input voltage signal Vin and the output voltage signal Vout exceeds the dead band (=0.8 V), the operation starts, and under a condition of Vin<Vout, the switch circuit 22 is turned ON by a detection signal P3 of the comparator 24, in addition to the output current of slow trailing down of the buffer amplifier 1, a current is sunk in high speed from the output terminal 10b to the ground GDN to thereby trail down the output voltage signal Vout.

The amount of current sunk from the switch circuit 22 at this moment is larger than the sunk output current value of the buffer amplifier 1. Since the load Co is connected to the output terminal 10b, even when the switch circuit 22 is in ON state, the relationship that $\Delta V'$ (=Vin—Vout) is equal to or more then 0.1 V is usually kept under a trailing down state, and the load Co is discharged by the sum of the sunk output current value of the buffer amplifier 1 and the current value sunk from the switch circuit 22. Further, at this moment, since no output signal is generated at the leading up side comparator 23, the switch circuit 21 is in OFF state.

When the input voltage Vin approaches "L" (LOW level) namely, the ground potential, the output voltage signal Vout follows the trailing down of the input voltage signal Vin and finally the potential difference between the input voltage signal Vin and the output voltage signal Vout drops below $\Delta V'$, the detection signal P3 ceases and the switch circuit 22 is turned OFF and the output voltage signal Vout is rendered to "L" by the output current from the buffer amplifier 1 of slow trailing down.

In this instance, when the comparing portion in the comparator 24 is constituted by MOS transistors, because of the existence of the dead band determined by the gate threshold value VTH2, although when a difference of the input voltage signal Vin from +VDD is less than 0.8 V, the comparator 24 is inoperative, however, the comparator 26 is operative. Accordingly, although the detection signal P3 which turns ON the switch circuit 22 is not generated from the comparator 24, if at this moment, the comparator 26, which operates in the dead band region VTH2 (+VDD~(+VDD−0.8)V, wherein in a region of Vin<Vout) of the comparator 24, is in a state of Vin<Vout, the comparator 26 generates a detection signal P4 and turns ON the switch circuit 22. Thereby, the output voltage signal Vout also enables to trail down in high speed.

Since the operation of the comparator 26 is restricted in a range of the dead band region VTH2 (+VDD~(+VDD−0.8) V) of the comparator 24 by the operation restricting circuit 28, when the dead band region is exceeded, the detection signal P4 which turns ON the switch circuit 22 ceases. However, at this moment since the comparator 24 has already started the operation, the detection signal P3 is generated and the ON state of the switch circuit 22 is maintained as it is.

Further, in the same manner as above, at the time of change over between the comparator 26 and the comparator 24, the switch circuit 22 receives the detection signals P3 and P4 from both and is rendered in ON state. When the input voltage signal Vin approaches the ground potential and the potential difference between the input voltage signal Vin and the output voltage signal Vout drops below $\Delta V'$ (=0.1 V), the switch circuit 22 turns OFF. At this moment, the comparator 26 is not operated. Moreover, because of a trailing down period, the comparator 25 is also not operated.

As a result, since the switch circuit 22 is not affected by the dead band of the comparator 24, the switch circuit 22 is turned ON.

Since the output signal of the comparator 24 is generated at a voltage of the dead band+the potential difference $\Delta V'$, in considering this point, in a region where the input voltage signal Vin shifts from the dead band region to the normal operation region, namely, in a voltage region moving in the dead band of the MOS transistors constituting the comparing portion of the comparator or in a voltage region moving out of the dead band, the switch circuit 22 is designed to turn ON by receiving both output signals from the comparator 24 and the comparator 26. When the dead band voltage of the input voltage signal Vin, namely, the between source-gate voltage is given as 0.8 V, the output signal of the comparator 26 ceases at a voltage of about +0.2 V with respect to the given voltage, and a lower voltage of about 1.0 V than the power source voltage +VDD is set as the operation stop voltage of the comparator 26, which will be explained later. Further, the voltage for stopping the output signal of the comparator 26 is enough if it falls in a range smaller than the half voltage after the input voltage signal having trailed down.

FIG. 2 is a concrete circuit diagram therefor. In FIG. 2, the same constitutional elements as those in FIG. 1 are designated by the same reference numerals.

The respective comparators 23-26 are constituted by a current switch circuit. The differential pair transistors of the comparator 23 are constituted by N channel MOS transistors TN1 and TN2. The offset voltage of above referred to potential difference $\Delta V$ (=0.1V) is determined by the difference of the operation threshold values between the transistors TN1 and TN2. The offset voltage of potential difference $\Delta V$ (=0.1V) is smaller than the dead band voltage of 0.8 V of these transistors TN1 and TN2. The offset voltage is obtained, for example, by breaking the pair forming property and by mismatching the threshold values of the pair of MOS transistors. Alternatively, the offset voltage can be also obtained by setting the channel width ratio of the pair of MOS transistors at 1:n (n is a number more than 1)

At the time when an input signal is leading up, the dead band voltage 0.8 V of these causes a problem. With regard to this dead band, since the comparator 25 is constituted by differential pair transistors of N channel MOS transistors TN3 and TN4, the dead band of the comparator 25 is not in the range of 0 V-0.8 V, because the P channel transistors are used therefor.

On one hand, the differential pair transistors of the comparator 24 are constituted by P channel MOS transistors TP3 and TP4. The offset voltage of above referred to potential difference $\Delta V'$ (=0.1V) is determined by the difference of the operation threshold values between the transistors TP3 and TP4. As explained above, the offset voltage of potential difference $\Delta V'$ is smaller than the dead band voltage of 0.8 V of these transistors TP3 and TP4.

At the time when an input signal is trailing down, the dead band voltage 0.8 V causes a problem. With regard to this dead band, since the comparators 26 is constituted by differential pair transistors of P channel MOS transistors TP1 and TP2, the dead band of the comparator 26 is not in the range of +VDD (=5.0V)~(+VDD−0.8) V, because the N channel transistors are used therefor.

Further, the input terminal 10a of the buffer amplifier 1 is connected to the respective gates of the transistors TN1, TP3, TN3 and TP1. The output terminal 10b of the buffer amplifier 1 is connected to the respective gates of the transistors TN2, TP4, TN4 and TP2.

The switch circuits 21 and 22 are respectively constituted by a P channel MOS transistor TP and an N channel MOS transistor TN. The source-drain of the transistor TP is connected between the power source line +VDD and the output terminal 10b and the source-drain of the transistor TN is connected between the ground GND and the output terminal 10b.

The gate of the transistor TP is connected to the drain of the transistor TN1 (as well as to the drain of the P channel MOS transistor TP5 serving as a load transistor therefor), which generates the detection signal P1 of the comparator 23, and further, connected to the drain of an output side transistor TN7. The transistor TN7 is connected in current mirror with a load transistor TN6 for the transistor TP2. By means of this current mirror circuit, the drain current of the transistor TP2, which corresponds to the detection signal P2 of the comparator 25, is transferred as the drain current of the output side transistor TN7 and drives the transistor TP constituting the switch circuit 21.

As a result, the detection signals P1 and P2 of the respective comparators 23 and 25 are generated respectively at the drain of the transistor TN1 and at the drain of the transistor TP2 (the drain of the transistor TN7) and the transistor TP is turned ON by these detection signals P1 and P2.

On one hand, the gate of the transistor TN is connected to the drain of the transistor TP3 (as well as to the drain of the N channel MOS transistor TP8 serving as a load transistor therefor), which generates the detection signal P3 of the comparator 24, and further, connected to the drain of an output side transistor TP10. The transistor TP10 is connected in current mirror with a load transistor TP9 for the transistor TN4. By means of this current mirror circuit, the drain current of the transistor TN4, which corresponds to the detection signal P4 of the comparator 26, is transferred as the drain current of the output side transistor TP10 and drives the transistor TN constituting the switch circuit 22.

As a result, the detection signals P3 and P4 of the respective comparators 24 and 26 are respectively generated at the drain of the transistor TP3 and the drain of the transistor TN4 (the drain of the transistor TP10) and the transistor TN is turned ON by these detection signals P3 and P4.

The respective comparators 23-26 include, as a constant current source in the current switch circuit, N channel or P channel MOS transistors TN9, TP11, TP12 and TN10 respectively. The gates of the transistors TN9 and TN10 are respectively connected to a constant voltage bias line Vb and the gates of the transistors TP11 and TP12 are respectively connected to a constant voltage bias line Va.

The operation restricting circuit 27 is disposed between the drain of the transistor TP12, which is a constant current source of a differential amplifier circuit in the comparator 25, and a common source of the differential pair transistors TP1 and TP2 and is constituted by a cascade connection circuit (series circuit) of transistors TP13 and TP14 of which source-drain are connected.

By disposing the operation restricting circuit 27 between the pair of differential transistors TP1 and TP2 of the differential amplifier circuit in the comparator 25 and the constant current source (transistor TP12) as explained above, the voltage range for the comparing operation can be restricted with the simple circuit.

The transistor TP14 of which gate and drain are diode connected is further connected to the common source of the transistors TP1 and TP2. The source side of the transistor TP14 is connected to the drain of the transistor TP13. Thereby, the transistor TP14, namely, a diode is turned OFF in response to a drain voltage of the transistor TP13. The turned OFF voltage is one when the gate voltage of the transistors TP1 and TP2 reaches a slightly higher voltage, for example, of about 1.0 V, than the dead band voltage (the voltage between the source and gate). The setting of the turned OFF voltage is performed by setting an adjusted predetermined constant voltage Vc at the gate of the transistor TP13. Alternatively, such voltage Vc is provided externally to the gate of the transistor TP13.

As a result, the differential pair transistors TP1 and TP2 in the comparator 25 operate in a range of the dead band (0 V~1.0 V) of the transistors TN1 and TN2, and when the transistors TP1 and TP2 are turned ON, both transistors TP13 and TP14 in the operation restricting circuit 27 are turned ON and when the gate voltage of the transistors TP1 and TP2 reaches about 1.0 V, the transistor TP14 is turned OFF to stop the operation of the comparator 25.

The operation restricting circuit 28 is disposed between the drain of the transistor TN10, which is a constant current source of a differential amplifier circuit in the comparator 26, and a common source of the differential pair transistors TN3 and TN4 and is constituted by a cascade connection circuit (series circuit) of transistors TN11 and TN12 of which source-drain are connected. The operation restricting circuit 28 is also disposed between the pair of differential transistors TN3 and TN4 of the differential amplifier circuit in the comparator 26 and the constant current source (transistor TN10).

The transistor TN12 of which gate and drain are diode connected is further connected to the common source of the transistors TN3 and TN4. The source side of the transistor TN12 is connected to the drain of the transistor TN11. Thereby, the transistor TN12, namely, a diode is turned OFF in response to a drain voltage of the transistor TN11. The turned OFF voltage is one when the gate voltage of the transistors TN3 and TN4 reaches a slightly lower voltage, for example, of about 4.0 V which is lower by 1.0 V from +VDD (=5.0 V), than the dead band voltage. The setting of the turned OFF voltage is performed by setting an adjusted predetermined constant voltage Vd at the gate of the transistor TN11. Alternatively, such voltage Vd is provided externally to the gate of the transistor TN11.

As a result, the differential pair transistors TN3 and TN4 in the comparator 26 operate in a range of the dead band (+VDD (=5.0 V)~4.0 V) of the transistors TP3 and TP4, and when the transistors TN3 and TN4 are turned ON, both transistors TN11 and TN12 in the operation restricting circuit 28 are turned ON and when the gate voltage of the transistors TP1 and TP2 reaches about +VDD (=5.0 V)~4.0 V, the transistor TP12 is turned OFF to stop the operation of the comparator 26.

On one hand, the buffer amplifier 1 is an amplifying circuit including a drive stage constituted by differential amplifiers 11 and 12 and a CMOS structured output stage circuit 13. The output stage circuit 13 is constituted by a P channel MOS transistor QP and an N channel MOS transistor QN, and these transistor QP and transistor QN are driven in common by the differential amplifiers 11 and 12. Thereby, the buffer amplifier 1 is constituted as an amplifier which operates in a rail-to-rail.

The differential amplifier 11 is a drive stage of which differential pair are constituted by N channel transistors, and among the differential pair N channel transistors Q1 and Q2, the gate of Q1 is connected to the input terminal 10a and the gate Q2 is connected to the output terminal 10b. Further, the differential amplifier 12 is a drive stage of which differential pair are constituted by P channel transistors, and among the differential pair P channel transistors Q3 and Q4, the gate of Q3 is connected to the input terminal 10a and the gate Q4 is connected to the output terminal 10b. Although the gates of the transistors Q2 and Q4 are respectively to be connected to (−) input terminal 10c, however, since the (−) input terminal is connected directly to the output terminal 10b, a specific illustration of the (−) input terminal 10c is omitted in FIG. 2.

The gate of the transistor QP in the output stage circuit 13 is connected to the drain of the transistor Q1 in the differential amplifier 11 and to the drain of an output side N channel MOS transistor Q5 in a current mirror circuit. The drain of the transistor Q5 is connected with an input side N channel MOS transistor Q6 in current mirror connection, and the drain current of the transistor Q4 in the differential amplifier 12 is transferred as a drain current of the transistor Q5 by the current mirror circuit. The current mirror circuit formed by the transistors Q5 and Q6 constitutes a turn-around circuit, which inverts the drive current generated at the transistor Q4 in the opposite direction.

As a result, the gate of the transistor QP is driven by the transistor Q1 of the differential amplifier 11 as well as the transistor Q4 of the differential amplifier 12.

The gate of the transistor QN in the output stage circuit 13 is connected to the drain of the transistor Q2 in the differential amplifier 12 and to the drain of an output side P channel MOS transistor Q8 in a current mirror circuit. The drain of the transistor Q8 is connected with an input side P channel MOS transistor Q9 in current mirror connection, and the drain current of the transistor Q2 in the differential amplifier 11 is transferred as a drain current of the transistor Q8 by the current mirror circuit. The current mirror circuit formed by the transistors Q8 and Q9 constitutes a turn-around circuit, which inverts the drive current generated at the transistor Q4 in the opposite direction.

As a result, the gate of the transistor QN is driven by the transistor Q3 of the differential amplifier 12 as well as the transistor Q2 of the differential amplifier 11.

Further, an N channel MOS transistor Q7 is diode connected and constitutes a load transistor for the transistor Q3, and to the drain thereof the drain of the transistor Q8 is connected. A P channel MOS transistor Q10 is diode connected and constitutes a load transistor for the transistor Q1, and to the drain thereof the drain of the transistor Q5 is connected.

Further, an N channel MOS transistor Q11 is a constant current source of the differential amplifier 11 and receives the bias voltage Vb. A P channel MOS transistor Q12 is a constant current source of the differential amplifier 12 and receives the bias voltage Va.

Now, since the buffer amplifier 1 is an amplifier circuit to which the output voltage of the output terminal 10b is fully fed back to the input, the respective transistors QP, QN and Q1~Q12 constituting the buffer amplifier 1 are constituted respectively by transistors for current output. Contrary thereto, the transistors constituting the comparators 23-26 and the transistors constituting the switch circuits 21 and 22 are transistors for switch operation.

Size (area) of source, drain and gate of a transistor for current output is different from that of a transistor for switch operation. Usually, since the transistor for switch operation only performs an ON/OFF operation, the transistor never performs a current amplifying operation in an analog manner. Thus, the width of the gate located between the source-drain thereof can be narrow and the transistor is formed in a small area transistor. In this regard, the transistor for current output has an area corresponding to its maximum output current value and the width of the gate located between the source-drain thereof enlarges. For this reason, the operation speed of the transistor for switch operation is faster than that of the transistor for current output. Therefore, the comparators 23-26 and the switch circuits 21 and 22 can be operated respectively as an output acceleration circuit.

Now, in FIG. 2, although the gate of a transistor TP14 in the switch circuit 25 is diode connected to the drain thereof, however, instead of the diode connection, to the gate of the transistor TP14 the input voltage signal Vin inputted to the input terminal 10a can be inputted. In this instance, the turned OFF timing of the transistor TP14 is determined in relation to the drain voltage or the source voltage of the transistor TP13 and the voltage of the input voltage signal Vin.

Likely, although the gate of a transistor TN12 is diode connected to the drain thereof, however, instead of the diode connection, to the gate of the transistor TN12 the input voltage signal Vin can be inputted. With this modification, the like operation can be obtained. In this instance, the turned OFF timing of the transistor TN12 is determined in relation to the drain voltage or the source voltage of the transistor TN11 and the voltage of the input voltage signal Vin.

Further, in the embodiment, although to the gate of the transistor TP13 the adjusted constant voltage Vc is applied and to the gate of the transistor TN11 the adjusted constant voltage Vd is applied, in place of these constant voltages Vc and Vd, the input voltage signal Vin can be applied to the gate of the transistor TP13 and the gate of the transistor TN11. When modifying in this manner, the bias circuit for generating the constant voltage Vc and Vd is unnecessitated. In this instance the turning ON/OFF timing of the transistor TP13 and the transistor TN11 and the operation comparison timing of the respective differential pair transistors TP1 and TP2 and the differential pair transistors TN3 and TN4 only slightly deviate, and the like operation as above can be obtained and no problems with regard to the operation are caused.

INDUSTRIAL APPLICABILITY

As has been explained hitherto, the operation restricting circuit in FIG. 2 embodiment is only an example and the present invention is not limited to the embodiment. The values of the offset voltages $\Delta V$ and $\Delta V'$ are only examples and the present invention is not limited to ones in the embodiment.

In the embodiment, although the comparing portion of the comparator is constituted by the differential pair transistors and the offset voltages $\Delta V$ and $\Delta V'$ are formed by the difference of the operation threshold values of the differential pair transistors, the offset voltages $\Delta V$ and $\Delta V'$ can be of course formed by such as varying the gate width ratio (channel width ratio), number of elements connected in parallel and series resistor inserted in the source.

Although the comparing portion in the comparators which operates in the dead band uses the differential pair transistors having high pair forming property so as to substantially eliminate the offset voltage in the embodiment, however, differential pair transistors having somewhat poor pair forming property can be used, if a remaining offset voltage is in a degree which causes no problems with regard to the offset voltages $\Delta V$ and $\Delta V'$, for example, less than $\Delta V/2$ or $\Delta V'/2$.

Although the output acceleration circuit in the embodiment is for supplying to or sinking from the output terminal 10b much output current at the times of leading up and trailing down of the buffer amplifier, in the present invention the output current can be supplied to or sunk from the output terminal at one of the times of leading up and trailing down of the buffer amplifier. In a case when only the leading up side of the buffer amplifier is accelerated, only the comparators 23 and 25 are required to be provided and, the comparators 24 and 26 and the switch circuit 22 are not required to be provided. The operation at the trailing side is determined only by the buffer amplifier.

In a case when only the trailing down side of the buffer amplifier is accelerated, only the comparators 24 and 26 are required to be provided, and the comparators 23 and 25 and the switch circuit 21 are not required to be provided. The operation at the leading up side is determined only by the buffer amplifier.

In addition, the ground potential as explained in the embodiment can be of course acceptable to be a predetermined reference potential different from the power source voltage.

The invention claimed is:

1. A buffer circuit comprising: a first comparator in which a comparing portion is constituted by one of P channel and N channel MOS transistors provided between an input terminal and an output terminal of a buffer amplifier for comparing an input voltage and an output voltage of the buffer amplifier and a predetermined offset voltage is set for the comparing operation in the comparing portion, and which performs the comparing operation when the predetermined offset voltage is exceeded, and a first switch circuit which turns ON/OFF in response to an output signal from the first comparator, wherein a leading up of an output voltage or a trailing down of an output voltage from the buffer amplifier is accelerated by flowing current from a power source line to the output terminal or from the output terminal to a reference potential line in response to ON or OFF of the first switch circuit, the buffer circuit further comprising a second comparator of which a comparing portion is constituted by the other of P channel and N channel MOS transistors for comparing the input voltage and the output voltage, and an operation restricting circuit for restricting the comparing operation of the second comparator in a range of a dead band of the one of P channel and N channel MOS transistors, wherein the first switch circuit is turned ON or OFF in response to the output signal of the first comparator and an output signal of the second comparator.

2. A buffer circuit according to claim 1, wherein the first operation restricting circuit causes the second comparator to generate an output signal when the input voltage is in a voltage region either below the dead band or above the dead band, and the first switch circuit is provided between the reference line and the output terminal, is selectively turned ON by one of the output signal of the first comparator and the output signal of the second comparator and receives the output signal of the first comparator and the output signal of the second comparator at the same time in the voltage region below the dead band or above the dead band to turn ON the same.

3. A buffer circuit according to claim 1, wherein the first operation restricting circuit causes the second comparator to generate an output signal when the input voltage is in a voltage region either below the dead band or above the dead band, and the first switch circuit is provided between the power source line and the output terminal, is selectively turned ON by one of the output signal of the first comparator and the output signal of the second comparator and receives the output signal of the first comparator and the output signal of the second comparator at the same time in the voltage region below or above the dead band to turn ON the same.

4. A buffer circuit according to claim 2, wherein the respective comparing portions of the first and second comparators are constituted by a pair of differential MOS transistors, the comparing portion of the second comparator performs the comparing operation with substantially no offset voltage and the predetermined offset voltage is formed by a difference of the operation threshold values of the pair of differential MOS transistors in the first comparator.

5. A buffer circuit according to claim 4, wherein the second comparator further includes a first constant current source for determining the operation current of the pair of differential transistors, the first operation restricting circuit is constituted by a another MOS transistor provided between the pair of differential transistors of the second comparator and the first constant current source, and a range of the voltage region below dead band or a range of the voltage region above the dead band is larger than the voltage value of the dead band+ the predetermined offset voltage and is less than a half voltage value of a leading up voltage of the input voltage signal or a half voltage value of a trailing down start voltage.

6. A buffer circuit according to claim 5, wherein the comparing portions of the first and second comparators and the first switch circuit are constituted by transistors for switch operation, the buffer amplifier is constituted by transistors for current output and the first operation restricting circuit is formed as a circuit in which a plurality of the another MOS transistors are connected in cascade.

7. A buffer circuit according to claim 6, wherein the first and second comparators are constituted by a current switch circuit, the offset voltage value is less than the voltage value of the dead band, and the buffer amplifier is an amplifier operable in a rail-to-rail, which includes a drive stage constituted by a first differential amplifier circuit having differential pair P channel MOS transistors and a second differential amplifier circuit having differential pair N channel MOS transistors and a CMOS circuit output stage driven by these first and second differential amplifier circuits.

8. A buffer circuit according to claim 2, further comprising third and fourth comparators, a second switch circuit and a second operation restricting circuit, wherein a comparing portion for comparing between the input voltage and the output voltage in the third comparator is constituted by other MOS transistors having the other of P channel and N channel, for the comparing operation of the comparing portion the predetermined offset voltage or an offset voltage other than the predetermined offset voltage is set and the second switch circuit is turned ON/OFF in response to an output signal from the third comparator, a comparing portion for comparing between the input voltage and the output voltage in the fourth comparator is constituted by other MOS transistors having the one of P channel and N channel, the second operation restricting circuit is for restricting the comparing operation of the fourth comparator in a dead band range of the other MOS transistors constituting the comparing portion of the fourth comparator.

9. A buffer circuit according to claim 8, wherein the second operation restricting circuit causes the fourth comparator to generate an output signal when the input voltage is in a voltage region either below the dead band or above the dead band of the other MOS transistors in the third comparator and in the dead band region, the second switch circuit is provided between the reference line and the output terminal, is selectively turned ON by one of the output signal of the third comparator and the output signal of the fourth comparator and receives the output signal of the third comparator and the output signal of the fourth comparator at the same time in the voltage region below or above the dead band to turn ON the same.

10. A buffer circuit according to claim 9, wherein the respective comparing portions of the third and fourth comparators are constituted by a pair of differential MOS transistors, the comparing portion of the fourth comparator performs the comparing operation with substantially no offset voltage and the predetermined offset voltage or the other offset voltage is formed by a difference of the operation threshold values of the pair of differential MOS transistors in the third comparator.

11. A buffer circuit according to claim 10, wherein the first through fourth comparators are constituted by a current switch circuit, the predetermined offset voltage value or the other offset voltage is less than the voltage value of the dead band, the fourth comparator further includes a second constant current source for determining the operation current for the pair of differential transistors, the second operation restricting circuit is constituted by another MOS transistor provided between the pair of differential transistors and the second constant current source and the buffer amplifier is an amplifier operable in a rail-to-rail, which includes a drive stage constituted by a first differential amplifier circuit having differential pair P channel MOS transistors and a second differential amplifier circuit having differential pair N channel MOS transistors and a CMOS circuit output stage driven by these first and second differential amplifier circuits.

12. A buffer circuit comprising a first comparator in which a comparing portion is constituted by one of P channel and N channel MOS transistors provided between an input terminal and an output terminal of a buffer amplifier for comparing an input voltage and an output voltage of the buffer amplifier and a first offset voltage is set for the comparing operation in the comparing portion, and which performs the comparing operation when the first offset voltage is exceeded, a second comparator in which a comparing portion is constituted by the other of P channel and N channel MOS transistors for comparing the input voltage and the output voltage and a second offset voltage is set for the comparing operation in the comparing portion of the second comparator, and which performs the comparing operation when the second offset voltage is exceeded, a first switch circuit which turns ON/OFF in response to an output signal from the first comparator, a second switch circuit which turns ON/OFF in response to an output signal from the second comparator, wherein a leading up of the output voltage from the buffer amplifier is accelerated by flowing current from a power source line to the output terminal in response to ON or OFF of the first switch circuit and a trailing down of an output voltage from the buffer amplifier is accelerated by sinking current from the output terminal to a reference potential line in response to ON or OFF of the second switch circuit, the buffer circuit further comprising a third comparator of which comparing portion is constituted by other MOS transistors having the one of P channel and N channel for comparing between the input voltage and the output voltage of the buffer amplifier, a fourth comparator of which comparing portion is constituted by other MOS transistors having the other of P channel and N channel for comparing between the input voltage and the output voltage of the buffer amplifier, a first operation restricting circuit for restricting the comparing operation of the third comparator in a range of a dead band of the transistors constituting the comparing portion for the first comparator, a second operation restricting circuit for restricting the comparing operation of the fourth comparator in a range of a dead band of the transistors constituting the comparing portion for the second comparator, wherein the first switch circuit is turned ON or OFF in response to the output signal of the first comparator and the output signal of the third comparator and the second switch circuit is turned ON or OFF in response to the output signal of the second comparator and the output signal of the fourth comparator.

13. A driver IC comprising a plurality of the buffer circuit according to claim 1.

14. A display device comprising the driver IC according to claim 13, wherein the plurality of buffer circuits in the driver IC are provided for corresponding terminals of a display panel, respectively and the respective output voltages are sent out to the respective terminals.

15. A display device according to claim 14, wherein the display panel is an active matrix type organic EL display panel.

\* \* \* \* \*